US006570364B2

United States Patent
Haid et al.

(10) Patent No.: US 6,570,364 B2
(45) Date of Patent: May 27, 2003

(54) CIRCUIT AND METHOD FOR MONITORING THE OPERATIONAL RELIABILITY OF RECHARGEABLE LITHIUM CELLS

(75) Inventors: Rainer Haid, Ellwangen (DE); Peter Birke, Ellwangen (DE); Konrad Holl, Aalen-Dewangen (DE); Dejan Ilic, Ellwangen (DE)

(73) Assignee: Microbatterie GmbH (DE)

(*) Notice: Subject to any disclaimer, the term of this patent is extended or adjusted under 35 U.S.C. 154(b) by 0 days.

(21) Appl. No.: 10/056,854

(22) Filed: Jan. 25, 2002

(65) Prior Publication Data

US 2002/0105304 A1 Aug. 8, 2002

(30) Foreign Application Priority Data

Feb. 3, 2001 (DE) .......................... 101 04 981

(51) Int. Cl.⁷ .................. H02J 7/00; H02J 7/04
(52) U.S. Cl. ...................... 320/136; 320/152
(58) Field of Search .................. 320/135, 136, 320/150, 152

(56) References Cited

U.S. PATENT DOCUMENTS 5,936,385 A * 8/1999 Patillon et al. ............. 320/130
6,232,748 B1 * 5/2001 Kinoshita ................... 320/132

FOREIGN PATENT DOCUMENTS

WO   WO 96/15563   5/1996

* cited by examiner

Primary Examiner—Gregory J. Toatley, Jr.
(74) Attorney, Agent, or Firm—Schnader Harrison Segal & Lewis LLP

(57) ABSTRACT

A method for monitoring the operational reliability of rechargeable lithium cells including measuring the cell voltage and cell temperature, the cell is discharged if a predetermined cell limit voltage ($U_G$) and a predetermined ambient limit temperature $T_G$ are exceeded at the same time, until a predetermined lower voltage level or a predetermined lower ambient temperature is reached. A circuit for carrying out the method has a first threshold value switch which responds when a predetermined upper limit voltage ($U_G$) is exceeded in the cell, and a second threshold value switch (C) which responds when a predetermined ambient temperature limit ($T_G$) is exceeded, and has a logic circuit (E) which connects (G) the cell to a load when the first and second threshold value switches respond at the same time, wherein both threshold value switches (C, D) are configured such that they trip when a lower cell voltage or a lower ambient temperature is reached.

8 Claims, 1 Drawing Sheet

CIRCUIT AND METHOD FOR MONITORING THE OPERATIONAL RELIABILITY OF RECHARGEABLE LITHIUM CELLS

FIELD OF THE INVENTION

The invention relates to a circuit and method for monitoring the operational reliability of rechargeable lithium cells, by measuring and monitoring the cell voltage and the cell temperature.

BACKGROUND

Rechargeable lithium/ion cells require a special charging technique and, in particular, predetermined switch-off voltages must be complied with exactly while, if the charger fails, a protective circuit must prevent and inhibit further charging. When such cells are being discharged, specific voltage lower limits must not be infringed, to avoid irreversible damage to the cell. Lithium-ion cells are thus provided with special electronic protective switches which switch off at predetermined final charging and discharge voltages if the charger or the appliance behaves incorrectly and, together with special protection devices, are intended to protect the cell against unacceptable voltage levels and currents, and to prevent dangerous situations occurring, which could result in irreversible decomposition of the electrolyte and cell damage. Chargers with such monitoring functions are described, for example, in WO96/15563.

Thus, it would be advantageous to provide a method which further improves the operational reliability of rechargeable lithium cells.

SUMMARY OF THE INVENTION

This invention relates to a method for monitoring operational reliability of rechargeable lithium cells including measuring cell voltage and cell temperature, and discharging the cell if a predetermined cell limit voltage ($U_G$) and a predetermined ambient limit temperature ($T_G$) are exceeded substantially at the same time, until a predetermined lower voltage level or a predetermined lower ambient temperature is reached.

This invention also relates to a circuit arrangement for carrying out the above method and includes a first threshold value switch (D) connected to respond when a predetermined upper limit voltage ($U_G$) is exceeded in the cell, a second threshold value switch (C) connected to respond when a predetermined ambient temperature limit ($T_G$) is exceeded, and a logic circuit (E) which connects load resistance (G) to a load when the first and second threshold value switches (D) and (C) respond at substantially the same time, and wherein the first and second threshold value switches (C) and (D) are configured such that they trip when a lower cell voltage or a lower ambient temperature is reached.

BRIEF DESCRIPTION OF THE DRAWINGS

The subject matter of the invention will be explained in more detail in the following text with reference to the Figures.

DETAILED DESCRIPTION

The method according to the invention protects the lithium cell against electrochemical decomposition at high temperature and in critical charge states, while discharging the cell until sufficient capacity is still available that the cell is no longer in a critical charge state or at a critical temperature.

Figure 1:
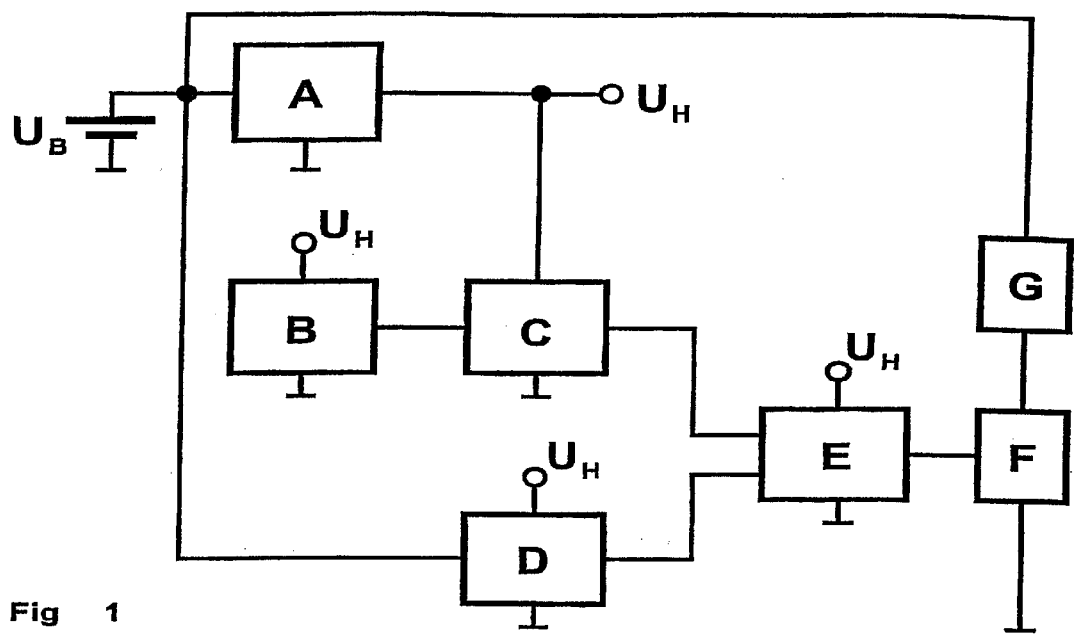
FIG. 1 in this case shows a schematic circuit diagram of a circuit arrangement which is suitable for carrying out the method.
Figure 2:
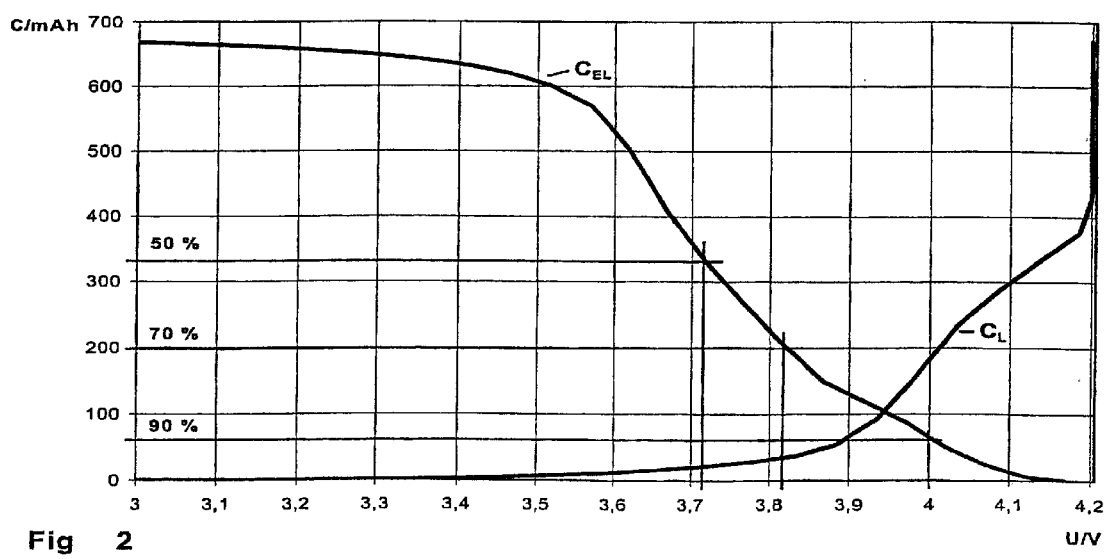
FIG. 2 shows the profile of the cell capacity as a function of the cell voltage during charging $C_L$ and discharging $C_{EL}$ during a charging/discharging cycle, which is carried out with a current of C/2.

Referring to FIG. 1, the battery voltage $U_B$ is used to produce an auxiliary voltage $U_H$ in the circuit module A, which is required to ensure correct operation of the threshold value switches and logic gates in the entire circuit. The stable auxiliary voltage $U_H$ is preferably considerably less than the minimum battery voltage. The battery voltage in the lithium cells under consideration here is between about 2.7 and about 4.2 volts, so that the stable auxiliary voltage may be, for example, approximately 2.5 volts.

A temperature sensor B produces a voltage signal which is proportional to the ambient temperature, and is supplied to a threshold value switch C. If a predetermined upper limit temperature $T_G$ is exceeded, the threshold value switch C changes to the on state. This threshold value switch is configured with hysteresis. It switches back to the off state only when the temperature falls below a new level, which is considerably below the limit temperature $T_G$. A further threshold value switch D switches to the on state when the battery voltage reaches a predetermined upper limit value $U_G$. This threshold value switch is also configured with hysteresis, so that it does not switch back to the off state until a considerable separation is reached between the previously achieved limit voltage $U_G$ and the voltage that occurs subsequently.

The output signals from the two threshold value switches C and D are fed to a logic gate, via which the load resistance G is connected by the switch F to the battery when both the temperature and the voltage reach the predetermined limit values. This discharging process is interrupted when either the cell voltage has fallen considerably below the limit voltage $U_G$ of the threshold value switch D or the ambient temperature has fallen below the lower switching threshold of the threshold value switch C.

A voltage of approximately 4 volts is preferably chosen as the upper limit voltage. This corresponds to a cell charge state of 90%, and the upper limit temperature $T_G$ is defined to be about 80°. The discharging of the cell, which takes place when both limit values are overshot, should be carried out down to a voltage of approximately 3.82 volts, i.e., down to a charge state of 70%. However, it may also be sufficient for the discharging process to allow the voltage to fall only to approximately 3.9 volts, with about 70° C. or about 60° C. being chosen as the lower limit value for the temperature.

The voltage and temperature limit values are determined and defined specifically for each system. In order to define the lower voltage value, the lower limit voltage is chosen such that, at the end of the discharging process, the voltage does not recover above the upper limit value once again, so that it would not be possible for the circuit to oscillate.

Configuring the threshold value switches with hysteresis largely prevents any tendency to oscillate. The functions of the described outline circuit can be incorporated in known IC circuits which are used for monitoring the operation of rechargeable lithium cells.

The measures according to the invention allow rechargeable lithium cells, in particular, lithium polymer cells, to be protected against mechanical and electrochemical damage at high temperatures, as a result of charge states at which secondary electrochemical reactions can occur due to the level of the cell voltage and the level of the ambient temperature, resulting in an increase in the internal resistance and capacity losses.

What is claimed is:

1. A method for monitoring operational reliability of a rechargeable lithium cell comprising:

measuring cell voltage and cell temperature; and discharging the cell if a predetermined cell limit voltage ($U_G$) and a predetermined ambient limit temperature ($T_G$) are exceeded substantially at the same time, until a predetermined lower voltage level or a predetermined lower ambient temperature is reached.

2. The method as claimed in claim 1, wherein the limit voltage ($U_G$) is about 4.0 volts, and the limit temperature ($T_G$) is approximately 80° C.

3. The method as claimed in claim 1, wherein the lower voltage level is less than about 3.9 volts, and the lower ambient temperature limit is about 70° C.

4. The method as claimed in claim 2, wherein the lower voltage level is less than about 3.9 volts, and the lower ambient temperature limit is about 70° C.

5. The method as claimed in claim 1, wherein the lower limit voltage is about 3.82 volts, and the lower limit temperature is about 60° C.

6. The method as claimed in claim 2, wherein the lower limit voltage is about 3.82 volts, and the lower limit temperature is about 60° C.

7. A circuit for carrying out the method as claimed in claim 1 comprising:

a first threshold value switch (D) connected to respond when a predetermined upper limit voltage ($U_G$) is exceeded in the cell;

a second threshold value switch (C) connected to respond when a predetermined ambient temperature limit ($T_G$) is exceeded; and a logic circuit (E) which connects load resistance (G) to a load when the first and second threshold value switches (D) and (C) respond at substantially the same time, and wherein the first and second threshold value switches (C) and (D) are configured such that they trip when a lower cell voltage or a lower ambient temperature is reached.

8. A circuit arrangement for monitoring operational reliability of a rechargeable lithium cell comprising:

a first threshold value switch (D) connected to respond when a predetermined upper limit voltage ($U_G$) is exceeded in the cell;

a second threshold value switch (C) connected to respond when a predetermined ambient temperature limit ($T_G$) is exceeded; and a logic circuit (E) which connects load resistance (G) to a load when the first and second threshold value switches (D) and (C) respond at substantially the same time, and wherein the first and second threshold value switches (C) and (D) are configured such that they trip when a lower cell voltage or a lower ambient temperature is reached.

* * * * *

UNITED STATES PATENT AND TRADEMARK OFFICE
CERTIFICATE OF CORRECTION

PATENT NO.   : 6,570,364 B2
DATED        : May 27, 2003
INVENTOR(S)  : Haid et al.

It is certified that error appears in the above-identified patent and that said Letters Patent is hereby corrected as shown below:

Title page,
Item [73], please change "Microbatterie GmbH" to -- VARTA Microbattery GmbH --.

Signed and Sealed this

Twenty-first Day of October, 2003

JAMES E. ROGAN
*Director of the United States Patent and Trademark Office*